US006214641B1

(12) United States Patent
Akram

(10) Patent No.: US 6,214,641 B1
(45) Date of Patent: *Apr. 10, 2001

(54) METHOD OF FABRICATING A MULTI-CHIP MODULE

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/447,983

(22) Filed: Nov. 23, 1999

Related U.S. Application Data

(63) Continuation of application No. 09/166,370, filed on Oct. 5, 1998, now Pat. No. 5,998,865, which is a continuation of application No. 08/811,935, filed on Mar. 5, 1997, now Pat. No. 5,817,535, which is a division of application No. 08/668,765, filed on Jun. 25, 1996, now Pat. No. 5,723,907.

(51) Int. Cl.[7] ............... H01L 21/44; H01L 21/48; H01L 21/50

(52) U.S. Cl. ............... 438/107; 438/15; 438/14; 438/106; 438/108; 438/109

(58) Field of Search .................... 438/106, 109, 438/121, 125, 107, 108

(56) References Cited

U.S. PATENT DOCUMENTS

| 4,992,849 | 2/1991 | Corbett et al. . |
|---|---|---|
| 4,992,850 | 2/1991 | Corbett et al. . |
| 4,996,587 | 2/1991 | Hinrichsmeyer et al. . |
| 5,107,328 | 4/1992 | Kinsman . |
| 5,137,836 | 8/1992 | Lam . |
| 5,239,198 | 8/1993 | Lin et al. . |
| 5,255,156 | 10/1993 | Chang . |
| 5,280,192 | 1/1994 | Kryzaniwsky . |
| 5,418,687 | 5/1995 | Chen . |
| 5,465,470 | 11/1995 | Vongfuangfoo et al. . |
| 5,477,082 | 12/1995 | Buckley, III et al. . |
| 5,480,840 | 1/1996 | Barnes et al. . |
| 5,495,398 | 2/1996 | Takiar et al. . |

Primary Examiner—John F. Niebling
Assistant Examiner—David A Zarneke
(74) Attorney, Agent, or Firm—Trask Britt

(57) ABSTRACT

A lead-over-chip single-in-line memory module (LOC SIMM) and method of manufacturing is disclosed that provides for shortened wire bonds and ease of rework for unacceptable semiconductor dice. More specifically, the LOC SIMM of the present invention includes a plurality of slots extending through a circuit board with an equal number of semiconductor dice attached thereto such that the active surfaces of the dice are exposed through the slots. Wire bonds or TAB connections are made from the exposed active surface of the die, through the slot, and to contacts on the top surface of the circuit board. Dice proven unacceptable during burn-in and electrical testing of the module are replaced by known good dice (KGD) by breaking their respective wire bonds, attaching a KGD to the circuit board, and forming new electrical connections between the KGD and the circuit board.

16 Claims, 5 Drawing Sheets

METHOD OF FABRICATING A MULTI-CHIP MODULE

CROSS REFERENCE TO RELATED APPLICATION

This application is a continuation of U.S. patent application Ser. No. 09/166,370, filed Oct. 5, 1998 now U.S. Pat. No. 5,998,865, issued Dec. 7, 1999 which is a continuation of U.S. patent application Ser. No. 08/811,935, filed Mar. 5, 1997, now U.S. Pat. No. 5,817,535, issued Oct. 6, 1998, which is a divisional of U.S. patent application Ser. No. 08/668,765, filed Jun. 25, 1996, now U.S. Pat. No. 5,723,907, issued Mar. 3, 1998.

BACKGROUND OF THE INVENTION

1. Field of the Invention

This invention relates generally to a leads-over-chip single-in-line memory module (LOC SIMM) and, more specifically, to an LOC SIMM having a plurality of slots formed in a substrate and a plurality of semiconductor dice attached by their active surfaces to the bottom surface thereof to allow passage of wire bonds from bond pads on the active surface of the semiconductor dice to traces on the upper surface of the substrate that extend over the active surface of each die. The invention has general applicability to all types of multi-chip modules (MCMs).

2. State of the Art

A leads-over-chip (LOC) integrated circuit (IC) typically includes a semiconductor die (die) mechanically attached and electrically connected to a LOC lead frame. In such an arrangement, the lead frame includes a plurality of lead fingers that extend over and are attached (adhered) to the active surface of the die. The lead fingers are also electrically connected to inputs and outputs (I/Os) or bond pads on the active surface by wire bonds and connect the die to external circuitry located on a substrate, such as a printed circuit board (PCB), to which the leads are affixed. Moreover, the lead fingers actually provide physical support for the die. The lead frame and die are typically encapsulated within a transfer-molded plastic package, although preformed ceramic and metal packages may also be used, depending on the operating environment and the packaging requirements of the die.

With ever increasing demands for miniaturization and higher operating speeds, multi-chip module systems (MCMs) are increasingly attractive for a variety of applications. Generally, MCMs may be designed to include more than one type of die within a single package, or may include multiples of the same die, such as the single inline memory module (SIMM) or dual in-line memory module (DIMM). While SIMMs comprising plastic-packaged dice surface-mounted on a PCB are common, SIMMs may also comprise an elongate planar PCB to which a plurality of identical bare semiconductor memory dice are attached by their back sides. The bare semiconductor dice are then wire bonded to the printed circuit board by a wire bonding apparatus, which typically connects the dice to the circuit board by means of wires, such as gold, aluminum, or other suitable metal or alloy. Such a SIMM configuration requires relatively long wires to be used to form the wire bond connects, which increases electrical parasitics such as inductance and resistance of the connections. That is, because the wires must extend from the top surface of each die to the plane of the circuit board surface, longer wires must be used to connect the dice than if the active surface of the dice was closer to the circuit board surface. Further, the extended lengths of the bond wires result in a susceptibility to damage and shorting during handling.

It is well known that semiconductor dice have a small but significant failure rate as fabricated, often referred to in reliability terms as infant mortality. As with all multi-die assemblies, this phenomenon is also present in SIMMs. For example, a SIMM composed of ten dice, each die having an individual reliability yield of 95%, would result in a first pass test yield of less than 60%, while a SIMM composed of twenty dice, each die having an individual reliability yield of 95%, would produce a first pass test yield of less than 36%. The market's adverse perception of this phenomenon has in the past affected decisions regarding use of SIMMs in various applications.

Previously, an unacceptable die in a SIMM, which has been subjected after assembly to burn-in and testing, has required either the removal and replacement of such a die and a second burn-in and testing cycle or the discard of the entire SIMM, both being time consuming and expensive. A second burn-in/test cycle thus subjects the non-defective dice of the SIMM to unnecessary thermal and electric stress. Additionally, removing and replacing an unacceptable die on a conventional SIMM may pose risk of damage to other SIMM components during the replacement operation.

Depending on the extent of testing and/or burn-in procedures employed, a die may typically be classified into varying levels of reliability and quality. For example, a die may meet only minimal quality standards by undergoing standard probe testing or ground testing while still in wafer form, while individual separated or "singulated" dice may be subjected to tests and burn-in at full-range potentials and temperatures, an acceptably tested and burned-in die being subsequently termed a "known good die" (KGD).

A cost-effective method for producing known reliable SIMMs is desirable for industry acceptance and use of SIMMs in various applications. In an attempt to provide known reliable SIMMs complying with consumer requirements, it is desirable either to fabricate a SIMM of KGD or to fabricate a SIMM of probe-tested (at the wafer level) dice and subsequently subject the SIMM to burn-in and performance testing to qualify the dice as a group. However, using only KGD in a SIMM may not be cost effective since each KGD has necessarily been subjected to individual performance and burn-in testing, which is costly. In contrast to the use of all KGD in a SIMM, using dice with well known production and reliability histories, particularly where the dice being used are known to have a low infant mortality rate, the use of such minimally tested dice to produce a SIMM may be the most cost effective alternative.

As previously stated, typical testing and burn-in procedures are generally labor and time intensive and a second test/burn-in cycle after removal and replacement of a defective die poses significant risks to the qualified dice of a SIMM. Therefore, in an instance where a SIMM is produced from minimally tested dice, in the event that SIMM contains an unacceptable die, replacement of unacceptable dice with a KGD would be preferable in the rework of the SIMM because rework with KGD should not require the SIMM to be subjected to further burn-in, but rather only performance testing. However, as previously noted, prior art practices for die replacement have required removal of a bad die and replacement thereof with a KGD in the same location.

A need exists for a LOC SIMM that provides for shorter wire bonds in comparison to conventional SIMM designs between each die and the SIMM circuit board and the cost-efficient fabrication of SIMMs of known performance and reliability requirements.

SUMMARY OF THE INVENTION

Accordingly, the present invention relates to a SIMM including a plurality of semiconductor dice attached thereto that provides for shortened wire bonds compared to SIMMs in the prior art and allows an unacceptable die to remain on board after replacement by a KGD. More specifically, the SIMM and its method of fabrication includes a module having the capacity to accommodate a plurality of semiconductor dice attached to a printed circuit board or other carrier substrate. More specifically, the printed circuit board has a plurality of slots corresponding to the number of semiconductor dice attached thereto. These slots are smaller in size than the perimeter of the semiconductor dice, such that the circuit board extends over at least a portion of the active surface of each die when the dice are attached to the bottom surface of the circuit board. Each semiconductor die includes a plurality of I/Os or bond pads on its active surface proximate the central region of each die. When properly aligned for die attach, the I/Os of such semiconductor dice lie within the openings in the circuit board defined by the slots. The I/Os of each semiconductor die are subsequently connected (e.g., by wire bonding or TAB attach) to traces located on the top surface of the circuit board. These traces generally lie near the perimeter of each slot for the shortest practical connection between the connections and I/Os of the die, but also extend transversely a sufficient distance away from the slot for accommodating wire bonding of a replacement KGD superimposed and back side-attached over the slot on the upper surface of the board.

In one embodiment, the bottom surface of the circuit board is substantially planar with a portion of the active surface of each of the semiconductor dice adhesively attached thereto. In another embodiment, the circuit board includes recessed portions which extend a distance into the bottom surface of the circuit board and are sized and shaped to receive semiconductor dice of corresponding configuration. Each recess is aligned with a slot such that the slot is positioned proximate the center of the recess. When the semiconductor dice are positioned and attached within each recess, the active surfaces of the dice are positioned closer to the top surface of the circuit board to shorten the lengths of the wire bonds necessary to connect the dice I/Os to the traces on the top surface of the circuit board.

Once all of the semiconductor dice of the SIMM have been attached and electrically connected, the SIMM is burned-in and tested to ensure that all of the semiconductor dice are properly functioning. If one or more of the dice of the SIMM fail burn-in or the electrical test, the wire bonds of the failed die or dice are simply disconnected as by pulling or severing. A KGD is then attached (adhered) by its back side to the top surface of the circuit board over the slot through which the defective die was wire-bonded, and the I/Os of the KGD are subsequently wire bonded to the same traces on the circuit board. As previously mentioned, the traces surrounding each slot extend a distance beyond the footprint defined by the perimeter of the KGD to accommodate wire bonding the KGD to the circuit board. Such a die replacement process reduces the amount of rework, testing and handling and also reduces the amount of space required on the PCB for replacement KGDs necessary to produce an acceptable SIMM.

While not necessarily preferred due to the difficulty of aligning a face-down die with a printed circuit board, nonetheless the KGD replacement for a proven bad die of a SIMM may be configured as a flip-chip type die with solder or other conductive balls or bumps in an array configured to mate with the trace patterns surrounding the slots. Thus, the conductive balls or bumps permit a face-down KGD to straddle the slot under which the defective die resides.

The circuit board may also include top and bottom walls or fences positioned around the perimeter of the circuit board and attached to the top and bottom surfaces, respectively. After the SIMM is characterized and reworked, if necessary, a flat, top sealing lid sized and shaped to fit over the top wall may be attached thereto to hermetically seal in the top surface of the circuit board, any KGD attached thereto, and the wire bonds. Similarly, a bottom lid sized and shaped to fit over the bottom wall may be attached thereto to seal in the bottom surface of the circuit board and the semiconductor dice attached thereto. The bottom wall may be of suitable height to cause the bottom lid to contact the bottom dice for heat transfer purposes, if desired.

Although the LOC SIMM of the present invention has been described in relation to several preferred embodiments, it is believed that major aspects of the invention are that the LOC SIMM provides for shortened wire bonds and for accommodation of replacement KGD without significant rework of the LOC SIMM. As noted previously, the present invention has equal utility in the fabrication of MCMs utilizing a plurality of die, at least some of which have different functions.

BRIEF DESCRIPTION OF THE SEVERAL VIEWS OF THE DRAWINGS

The features and advantages of the present invention can be more readily understood with reference to the following description and appended claims when taken in conjunction with the accompanying drawings wherein:

DETAILED DESCRIPTION OF THE INVENTION

Figure 1:
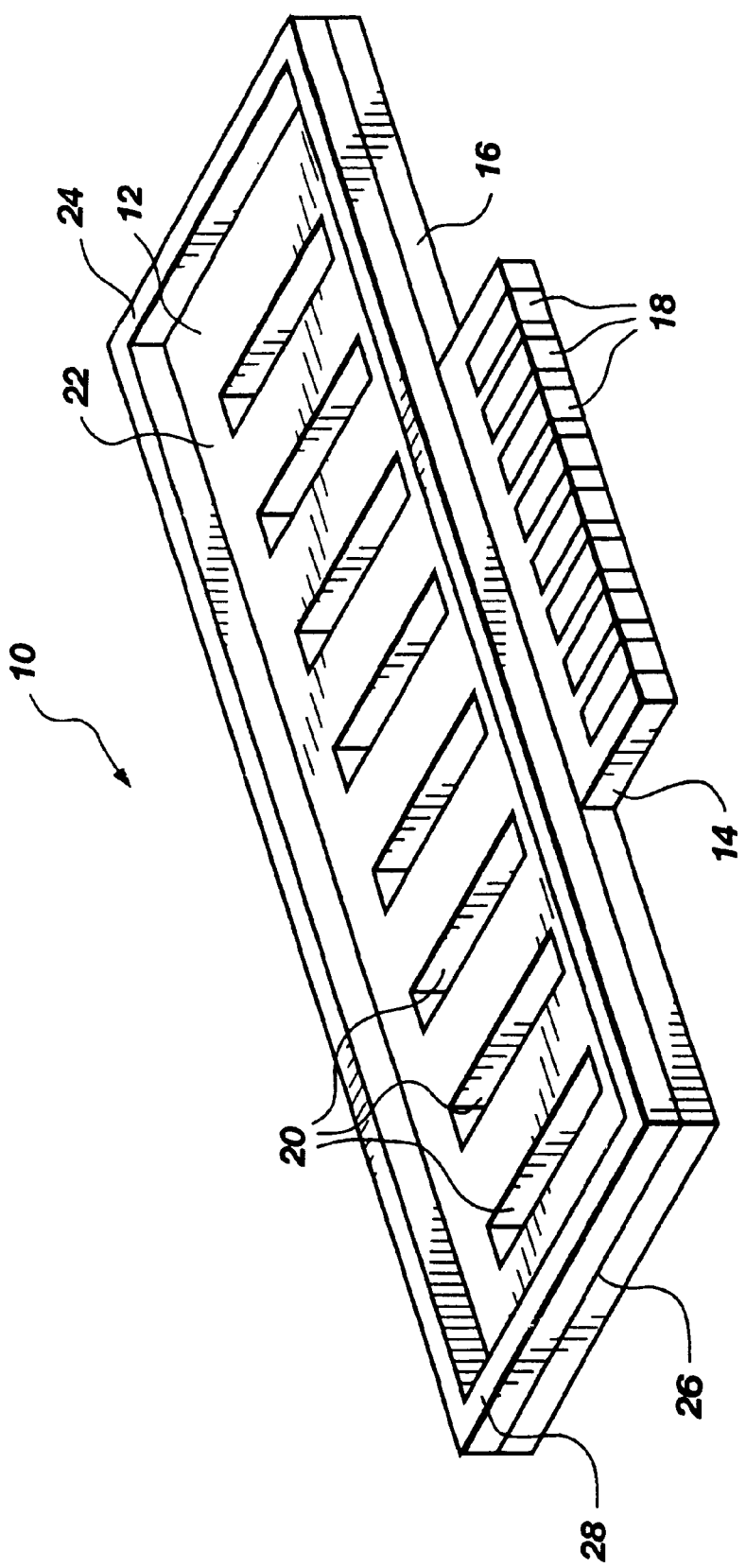
FIG. 1 is a perspective drawing of a single-in-line memory module (SIMM) circuit board in accordance with the present invention.

Referring to FIG. 1 of the drawings, a perspective view of a first embodiment of an exemplary LOC SIMM 10 according to the present invention is shown. The SIMM 10 is generally comprised of a substantially rectangular circuit board 12 having a plug-type connection 14 extending from a first side 16. The plug-type connection 14 includes a plurality of electrical connections 18 adapted to plug into a receptacle of a mother board or other higher-level package as known in the art. Circuit board 12 may comprise a composite, such as an FR-4 board, a ceramic or silicon substrate, or any other suitable material or materials known in the art.

The circuit board 12 includes a plurality of transversely extending, substantially mutually parallel openings or slots 20 that extend through the circuit board 12. The size of each slot 20 is dependent on the size and shape of the semiconductor die attached thereto and the configuration of the bond pads for wire bonding, such that the circuit board material does not cover the bond pads. As illustrated, SIMM 10 is configured for a plurality of identically functional memory dice.

Attached to or integrally formed with the top surface 22 of the circuit board 12 is a wall or fence 24 positioned about the perimeter 26 of the circuit board 12. A cover or lid having a similar size and shape as the area defined by the wall 24 may then be attached to the top surface 28 of the wall 24 to seal the components of the SIMM 10 from outside exposure. A similar wall and lid may also be attached to the bottom surface of the circuit board to seal to bottom of the SIMM 10 (see FIG. 6). Alternatively, the walls and lids may be integrally formed or separately preformed and then assembled before attachment to circuit board 12.

Figure 2:
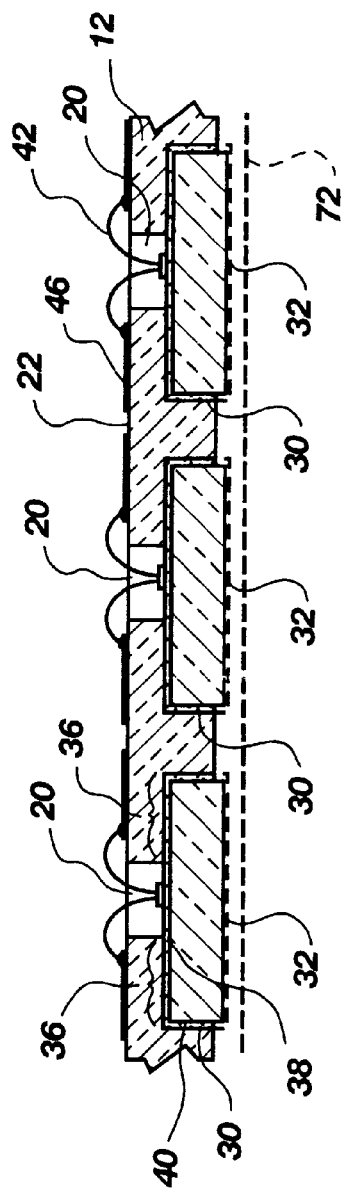
FIG. 2 is a partial, schematic cross-sectional view of a first embodiment of a SIMM in accordance with the present invention.

In FIG. 2, a partial cross-sectional view of a first preferred embodiment of the circuit board 12 is shown. Each slot 20 extends into a recess 30 which is sized and shaped to receive a semiconductor die 32. Each semiconductor die 32 is adhesively attached by a layer of adhesive 34 (FIG. 6) along a portion 36 of its active surface 38 and optionally along its periphery 40. The adhesive may comprise a liquid or gel adhesive, a polymer functioning as an adhesive, or a dielectric film or tape such as a polyimide coated on both sides with an adhesive. The manner of die attach is not critical to the invention.

The bond pads 44 (FIG. 3) of each semiconductor die 32 are then electrically connected by wire bonds 42 to bond areas of traces 46 on the top surface 22 of the circuit board 12. Moreover, because each semiconductor die 32 is positioned partially or completely in a recess 30, the active surface 38 of each semiconductor die 32 is located closer to the top surface 22 of the circuit board 12, resulting in a shortening of the length of wire necessary to properly form each wire bond 42 in comparison to prior art LOC arrangements employing top surface mounted dice on boards. Even without the use of recesses 30 (see FIG. 5), wire bonds 42 are shortened in comparison to prior art structures. It will also be appreciated that a TAB (tape automated bonding) attach, also termed a flex circuit, may be employed to connect bond pads 44 to traces 46. Flex circuits typically comprise conductors formed on a dielectric film such as a polyimide. The conductors of a flex circuit are typically simultaneously bonded, as by thermocompression bonding, to associated bond pads and traces. For purposes of this invention, elements 42 may therefore also be said to illustrate TAB connections, both wire bonds and TAB conductors generically comprising intermediate conductive elements.

Figure 3:
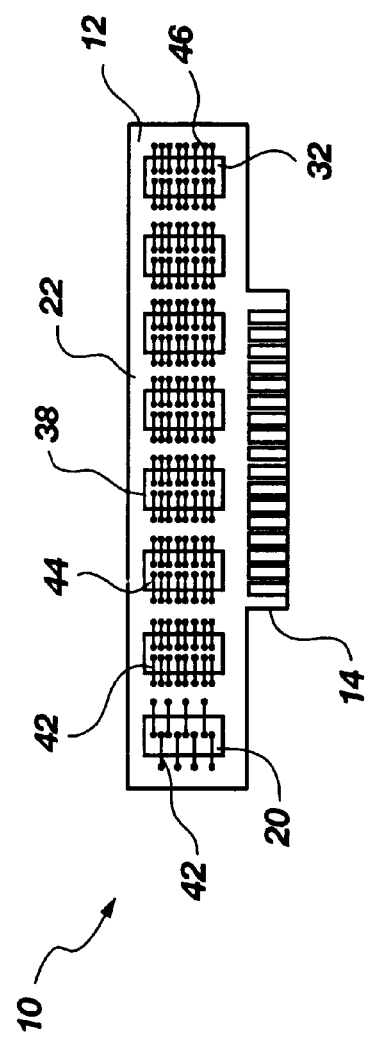
FIG. 3 is a schematic top view of a SIMM in accordance with the present invention including a plurality of semiconductor dice wire bonded thereto.

As better illustrated in FIG. 3, the wire bonds 42 extend from the bond pads 44 on the active surface 38 of the semiconductor die 32 to traces 46 on the top surface 22 of the circuit board 12. The bond pads 44, as shown, may be located in one or more longitudinal rows across the active surface 38 of the semiconductor die 32 generally proximate the center line of the semiconductor die 32. The lowermost slot 20 in FIG. 3 reveals a die with a single bond pad row having alternating-side wire bonds 42 to circuit board 12, while the remaining slots 20 bound dual bond pad row dice, each row being wire bonded to traces on the adjacent side of circuit board 12. As such, the width of each slot 20 may be narrowed to approximate the area occupied by the bond pads 44 on the active surface 38, adding sufficient clearance for wire-bonding tools. Typically, once all the wire bonds 42 are made, the SIMM 10 is tested to ensure that all of the semiconductor dice 32 are functioning according to specification. The SIMM 10 may be tested by inserting the plug-type connection 14 into a test fixture, as known in the art.

Figure 4:
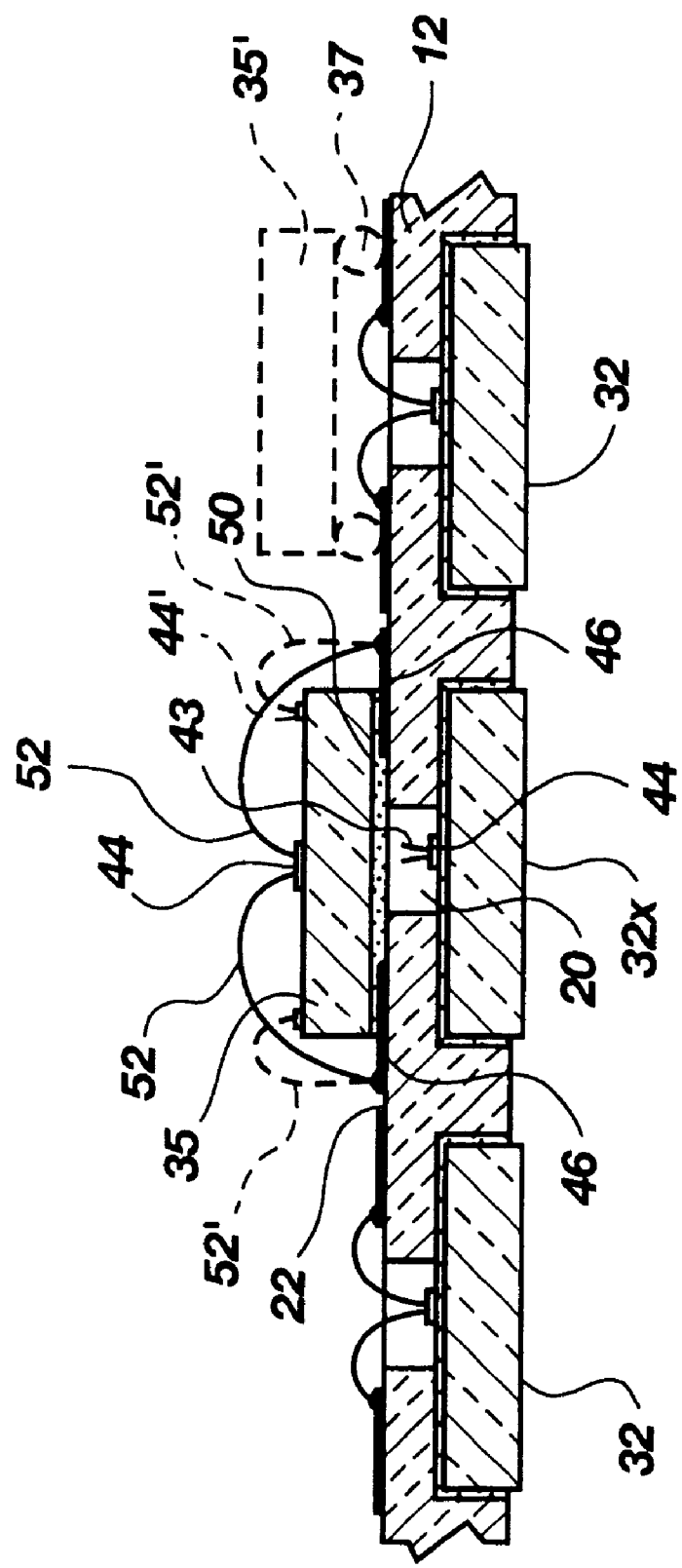
FIG. 4 is a partial, schematic cross-sectional view of the SIMM shown in FIG. 3 with a KGD attached to its top surface to replace an unacceptable die.

If, after testing, one or more semiconductor dice 32X (FIG. 4) are proven unacceptable, the SIMM can be easily repaired with minimal rework and without the need of removing any unacceptable semiconductor die 32. As shown in FIG. 4, rather than replacing the unacceptable die 32X, the wire bonds 42, or other intermediate conductive elements connecting the unacceptable die 32X to the circuit board 12, are disconnected by cutting or ripping, and a KGD 35 is back side-attached to the top surface 22 of the circuit board 12 by a layer of adhesive or a double-sided adhesive tape 50. The KGD 35 is attached over the slot 20 in substantial vertical alignment with the unacceptable semiconductor die 32X it is replacing. The traces 46, to which the bond pads 44 of unacceptable semiconductor die 32X were connected, extend over a sufficient length of the top surface 22 transverse to the orientation of slots 20 so that when a KGD 35 replaces the unacceptable semiconductor die 32X, new wire bonds 52 can be made to the same traces; 46. While KGD 35 has been depicted as including central bond pads 44, it is also contemplated that a replacement KGD may be selected having peripheral bond pads 44' as shown in broken lines so that wire bonds 52' (also in broken lines) may be foreshortened.

Further, and as previously noted, if alignment difficulties can be addressed, replacement KGD may comprise a flip-chip die such as 35' shown in broken lines, the connections 37 of such die, preferably comprising a conductive or conductor-carrying polymer curable by application of relatively low-level heat for a short period of time so as not to require a reflow step common with solder-based ball grid arrays (BGAs). However, where high temperatures are achievable, a flip-chip process can be employed.

Figure 5:
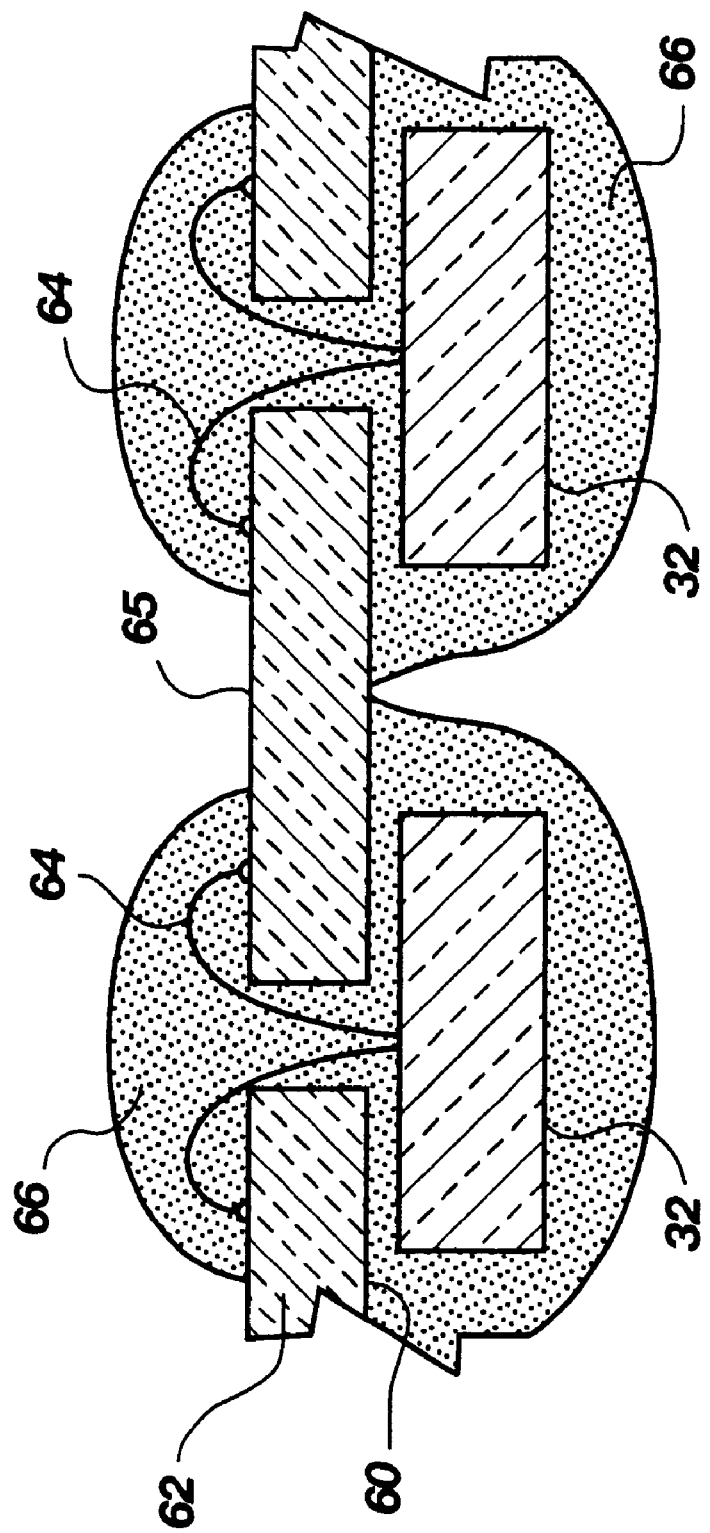
FIG. 5 is a partial, schematic cross-sectional view of a second embodiment of a SIMM in accordance with the present invention including a plurality of semiconductor dice that have been encapsulated in a glob top.

As shown in FIG. 5, it is not necessary to provide recesses, such as recess 30, in the bottom surface 60 of the circuit board 62. In this second preferred embodiment, the bottom surface 60 provides a substantially planar surface to which a plurality of semiconductor dice 32 may be attached. The wire bonds 64 are still shortened, compared to those of prior art back side attached, upper circuit board surface-mounted SIMMs, because a LOC arrangement is formed between the circuit board 62 and the semiconductor dice 32. As with the aforementioned embodiment, any semiconductor die 32 that is determined to be unacceptable may be replaced with a KGD 35 by breaking the wire bonds 64 and attaching the KGD 35 to the top surface 65 in the same location.

Figure 6:
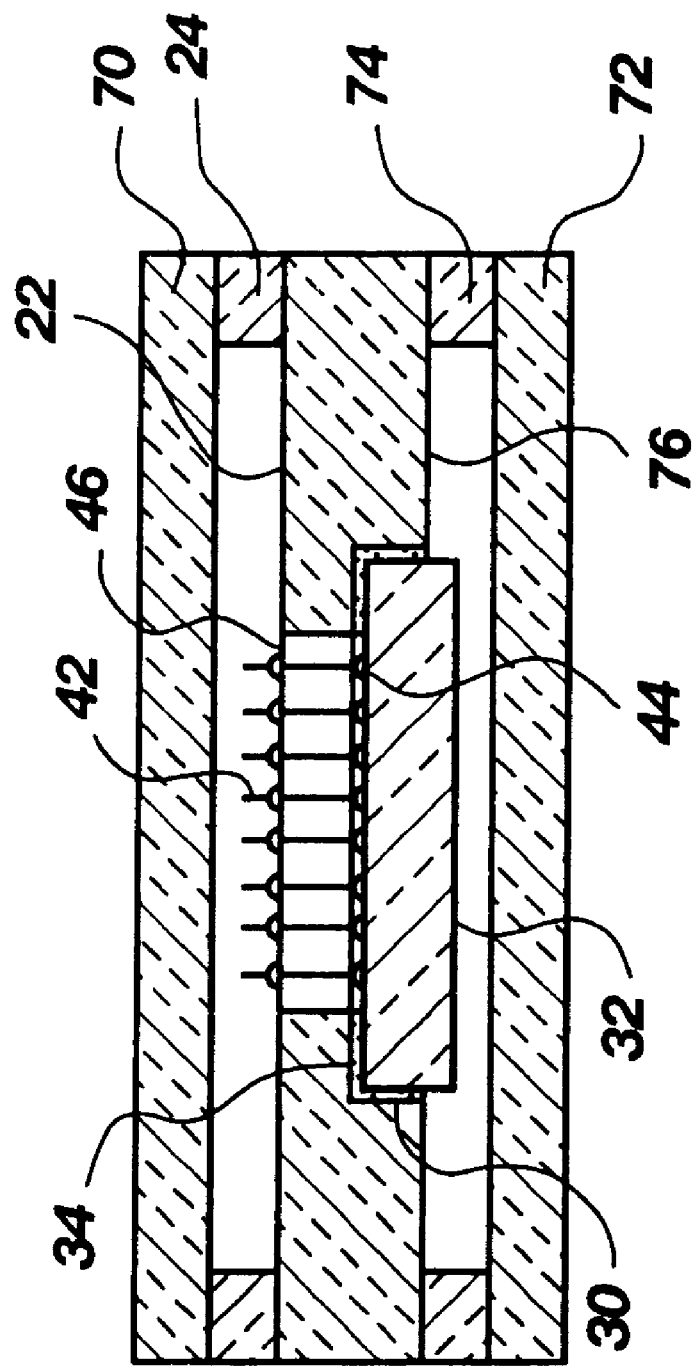
FIG. 6 is a cross-sectional view of a SIMM that has been fully assembled including top and bottom lids to seal the circuit board and its semiconductor dice.

Once the SIMM 10 has been tested and all unacceptable semiconductor dice 32X replaced with KGDs 35, it is preferable to seal the semiconductor dice 32 and 35' and all wire bonds to the circuit board 62. One simple method of encapsulating these components, is to use a plurality of non-conductive glob tops 66, as shown in FIG. 5, made of an epoxy, silicone gel, or other similar material known in the art to seal the dice, wire bonds and at least the wire-bonded trace ends of SIMM 10. Another technique is to utilize the wall 24 of FIG. 1 to adhesively or otherwise attach a cover or lid 70 to the circuit board 12 as illustrated in FIG. 6. FIG. 6 depicts a transverse, cross-sectional view of the embodiment shown in FIG. 2 with walls 24 and 74 and lids 70 and 72 respectively attached thereto. The lids 70 and 72 may be transparent, translucent or opaque; flexible or rigid; and comprised of plastic, ceramic, silicone or any other suitable material or combination thereof known in the art. Such an arrangement may be used to enclose the semiconductor dice 32 relative to the bottom surface of circuit board 12 and the wire bonds 42 and KGD 35 above the top surface of circuit board 12.

It will be recognized and appreciated that circuit boards having recesses 30 equal to or greater than die depth (see broken lines in FIG. 2) may merely employ a lid 72 adhered to the bottom surface of printed circuit board 12 to enclose semiconductor dice 32, a wall, such as 74, being unnecessary. Further, with such an arrangement, a bottom lid may comprise a heat-conductive material or be lined with such a material which extends to a passive or active heat-transfer structure exterior to SIMM 10.

In the exemplary embodiments, the LOC SIMM, as illustrated, has a generally rectangular configuration having a plurality of substantially rectangular slots formed therein. Those skilled in the art, however, will appreciate that the size, shape, number of slots and/or configuration of the circuit board may vary according to design parameters without departing from the spirit of the present invention. Further, the invention as disclosed has applicability to a wide variety of MCMs employing either a single-integrated, circuit-chip-type or different chip, as well as passive components such as chip-type capacitors. Moreover, those skilled in the art will appreciate that there may be other ways of attaching the semiconductor dice to the circuit board including modifications and combinations of the means described herein. It will also be appreciated by one of ordinary skill in the art that one or more features of one of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A method of manufacturing a multi-chip module, comprising:

providing a carrier substrate having a top side and a bottom side, a plurality of openings therethrough, at least one recess partially extending into said carrier substrate from said bottom side and aligned with one of said plurality of openings, and a plurality of conductive traces on said top side proximate each of said plurality of openings;

attaching a plurality of semiconductor dice each having an active surface with a plurality of bond pads disposed thereover adjacent said bottom side of said carrier substrate such that a portion of an active surface of each of said plurality of semiconductor dice is aligned with one of said plurality of openings and said plurality of bond pads is exposed therethrough, at least one of said plurality of semiconductor dice being secured at least partially within said at least one recess; and electrically connecting at least one of said plurality of conductive traces to at least one of said plurality of bond pads of each of said plurality of semiconductor dice through an intermediate conductive element to form a circuit including said conductive traces.

2. The method of claim 1, further including testing said plurality of semiconductor dice after electrical connection thereof to said plurality of conductive traces and identifying at least one defective die.

3. The method of claim 2, further including replacing said at least one defective die with at least another die in said circuit without physically removing said at least one defective die from said carrier substrate.

4. The method of claim 3, further including opening conductive paths defined by said intermediate conductive element connected between said at least one of said plurality of bond pads of said at least one defective die and said at least one of said plurality of conductive traces, attaching said at least another die to said top side over said one of said plurality of openings corresponding to said at least one defective die, and electrically connecting said at least another die to at least some of said plurality of conductive traces of said carrier substrate.

5. The method of claim 4, wherein said at least another die is back-side attached to said top side, and is electrically connected to said plurality of conductive traces through intermediate conductive elements.

6. The method of claim 5, wherein said intermediate conductive elements are selected from a group comprising wire bonds and TAB conductors.

7. The method of claim 4, wherein said at least another die is attached to said top side in active surface facing relationship thereto, and is electrically connected to said conductive traces by plurality of conductive protrusions extending transversely from said active surface to said plurality of conductive traces.

8. The method of claim 1, further including forming a wall around at least a portion of a perimeter of said top side of said carrier substrate.

9. The method of claim 8, further including attaching a lid to said wall.

10. The method of claim 1, further including forming a wall around at least a portion of a perimeter of said bottom side of said carrier substrate.

11. The method of claim 2, further including attaching a lid to said wall.

12. The method of claim 1, further including encapsulating said plurality of semiconductor dice.

13. The method of claim 12, wherein said encapsulating includes forming at least one glob top thereover.

14. The method of claim 1, further including forming at least some of said plurality of conductive traces on said top side of a length and orientation to extend away from openings to which said plurality of conductive traces are proximate a sufficient distance to permit placement of a die over each of said proximate openings which is functionally equivalent to a die under the same proximate opening and adjacent said bottom side with sufficient clearance from a perimeter of each die so placed to electrically connect to said extended traces through intermediate conductive elements.

15. A method of fabricating a multi-chip module, comprising:

providing a carrier substrate having a top side and a bottom side and a plurality of openings extending therethrough, a plurality of semiconductor dice each having an active surface including a plurality of bond pads thereon attached to said carrier substrate on said bottom side with said plurality of bond pads of each of said semiconductor dice exposed through an opening, at least some of said bond pads being electrically connected via intermediate conductive elements to conductors carried on said top side and proximate an opening through which said connected plurality of bond pads are exposed;

testing said semiconductor dice after attachment and connection to said carrier substrate and establishing the presence of at least one bad die on said carrier substrate; and attaching at least another die to said carrier substrate and electrically connecting said at least another die to said conductors in place of said at least one bad die without detaching said at least one bad die from said carrier substrate.

16. The method of claim 15, further comprising superimposing said at least another die over said at least one bad die and on an opposite side of said carrier substrate therefrom.

\* \* \* \* \*

UNITED STATES PATENT AND TRADEMARK OFFICE
CERTIFICATE OF CORRECTION

| | |
|---|---|
| PATENT NO. | : 6,214,641 B1 |
| APPLICATION NO. | : 09/447983 |
| DATED | : April 10, 2001 |
| INVENTOR(S) | : Salman Akram |

It is certified that error appears in the above-identified patent and that said Letters Patent is hereby corrected as shown below:

In the drawings:

In FIG. 4, change reference numeral "43" to reference numeral "42" to properly depict wire bonds

| | | |
|---|---|---|
| COLUMN 2, | LINE 39, | change "water" to --wafer-- |
| COLUMN 5, | LINE 17, | after "circuit board" insert --12-- |
| COLUMN 5, | LINE 51, | change "elements" to --wire bonds-- |
| COLUMN 6, | LINE 10, | after "die" change "32" to --32X-- |
| COLUMN 6, | LINE 24, | change "traces; 46" to --traces 46-- |
| COLUMN 6, | LINE 56, | after "wire bonds" insert --64-- |
| COLUMN 7, | LINE 5, | after "top surface" insert --22-- |
| CLAIM 7, COLUMN 8, | LINE 28, | after "said" and before "conductive" insert --plurality of-- |
| CLAIM 7, COLUMN 8, | LINE 29, | after "by" and before "conductive" delete "plurality of" |
| CLAIM 14, COLUMN 8, | LINE 56, | at beginning of line before "extended" insert --plurality of-- |

UNITED STATES PATENT AND TRADEMARK OFFICE
CERTIFICATE OF CORRECTION

PATENT NO.       : 6,214,641 B1
APPLICATION NO.  : 09/447983
DATED            : April 10, 2001
INVENTOR(S)      : Salman Akram It is certified that error appears in the above-identified patent and that said Letters Patent is hereby corrected as shown below:

Replace FIG. 4 with the following:

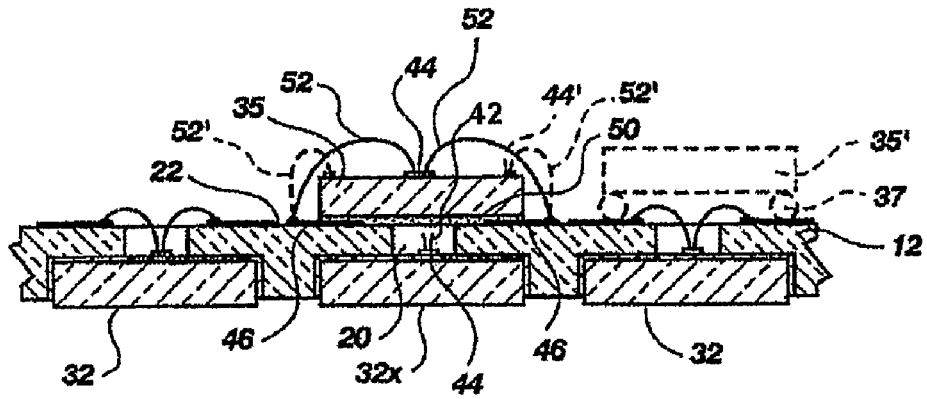

Fig. 4

Signed and Sealed this

Fourteenth Day of August, 2007

JON W. DUDAS
*Director of the United States Patent and Trademark Office*